(12) United States Patent
Hoffman et al.

(10) Patent No.: US 7,250,930 B2
(45) Date of Patent: Jul. 31, 2007

(54) TRANSPARENT ACTIVE-MATRIX DISPLAY

(75) Inventors: Randy Hoffman, Corvallis, OR (US); Michael J. Regan, Corvallis, OR (US); Susan Nakashima, Corvallis, OR (US); Marshall Field, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 239 days.

(21) Appl. No.: 10/361,045

(22) Filed: Feb. 7, 2003

(65) Prior Publication Data
US 2004/0155846 A1 Aug. 12, 2004

(51) Int. Cl.
G09G 3/36 (2006.01)

(52) U.S. Cl. .................. 345/87; 315/169.3

(58) Field of Classification Search ......... 345/87–93, 345/173, 175, 177; 315/169.3
See application file for complete search history.

(56) References Cited

U.S. PATENT DOCUMENTS

| | | | |
|---|---|---|---|
| 3,848,245 A * | 11/1974 | Marshall | 345/74.1 |
| 4,233,522 A * | 11/1980 | Grummer et al. | 341/33 |
| 4,383,255 A | 5/1983 | Grandjean et al. | |
| 4,449,123 A * | 5/1984 | Muranaga | 345/4 |
| 4,600,274 A * | 7/1986 | Morozumi | 349/109 |
| 4,766,471 A | 8/1988 | Ovshinsky et al. | |
| 5,032,007 A * | 7/1991 | Silverstein et al. | 349/79 |
| 5,044,736 A | 9/1991 | Jaskie et al. | |
| 5,132,676 A | 7/1992 | Kimura et al. | |
| 5,235,443 A | 8/1993 | Barnik et al. | |
| 5,295,009 A | 3/1994 | Barnik et al. | |
| 5,317,236 A * | 5/1994 | Zavracky et al. | 438/27 |
| 5,383,041 A | 1/1995 | Yamazaki et al. | |
| 5,416,494 A | 5/1995 | Yokota et al. | |
| 5,434,588 A | 7/1995 | Parker | |
| 5,517,341 A * | 5/1996 | Kim et al. | 349/42 |
| 5,673,062 A * | 9/1997 | Katakura et al. | 345/95 |
| 5,706,022 A | 1/1998 | Hato | |
| 5,724,107 A * | 3/1998 | Nishikawa et al. | 349/38 |
| 5,744,864 A | 4/1998 | Cillessen et al. | |
| 5,850,123 A | 12/1998 | Potter | |
| 6,107,980 A * | 8/2000 | Hermanns et al. | 345/90 |
| 6,346,718 B1 * | 2/2002 | Yamanaka et al. | 257/79 |
| 6,349,221 B1 | 2/2002 | Wolf et al. | |
| 6,408,257 B1 | 6/2002 | Harrington et al. | |
| 6,503,831 B2 | 1/2003 | Speakman | |

(Continued)

FOREIGN PATENT DOCUMENTS

EP 1134811 A1 9/2001

(Continued)

OTHER PUBLICATIONS

May, Mike, "Printing plastic transistors", American Scientist, Nov./Dec. 1998, vol. 86, Iss. 6, p. 523.*

(Continued)

Primary Examiner—Amr A. Awad
Assistant Examiner—Steven Holton

(57) ABSTRACT

A transparent active-matrix display based on a substrate has a multiplicity of transparent active pixel elements arranged in an array and transparent electrical connections to each pixel, whereby each of the pixel elements is adapted to be set independently to two or more states. In some embodiments, the substrate may also be transparent.

17 Claims, 7 Drawing Sheets

U.S. PATENT DOCUMENTS

| | | | |
|---|---|---|---|
| 6,724,511 B2* | 4/2004 | Gudesen et al. | 359/237 |
| 6,809,343 B2* | 10/2004 | Yamazaki et al. | 257/79 |
| 2004/0023432 A1 | 2/2004 | Haga | |

FOREIGN PATENT DOCUMENTS

| JP | 2003-086808 | 3/2003 |
|---|---|---|

OTHER PUBLICATIONS

C. G. Granqvist, Progress in electrochromics: tungsten oxide revisited, Electrochimica Acta V. 44 (1999) pp. 3005-3015.

L. Bouteiller et al., Polymer-dispersed liquid crystals: Preparation, operation and application, Liquid Crystals, V. 21 (2) (1996) pp. 157-174.

D. Coates, Polymer-dispersed Liquid Crystals, J. Mater. Chem. V. 5 (12) (1995) pp. 2063-2072.

Proceedings of the IEEE, Proceedings Letters, Nov. 1968, pp. 2094-2095.

Extended abstracts of the 2000 International Conference on Solid State Devices and Materials; Aug. 29-31, 2000, Sendai Intl Center, pp. 128-129.

Ohtomo, "Novel Semiconductor Technologies of ZnO Films towards . . . ", IEICE Trans. Electron., vol. E83-C, No. 10, Oct. 2000, pp. 1614-1617.

Boesen et al, "ZnO Field-Effect Transistor", Proceedings of the IEEE, Nov. 1968, pp. 2094-2095, vol. 56, Iss. 11, pub IEEE, Dept of Elec. Engrg, Northwestern Univ, Evanston, IL.

Kawasaki et al, "Can ZnO Eat Market in Optoelectronic Applications?", Extended Abstracts of the 2000 Intl Conf on Solid State Devices & Mtls, Sendai Intl Center, Aug. 29, 2000, pp. 128-129, Japan Society of Applied Physics, IEEE Electron Devices Society, Japan.

Ohtomo et al, "Novel Semiconductor Technologies of ZnO Films towards Ultraviolet LEDs and Invisible FETs", IEICE Trans. Electron, Oct. 2000, pp. 1614-1617, vol. E83-C, No. 10, Institute of Electronics Information and Communication Engineers, Japan.

* cited by examiner

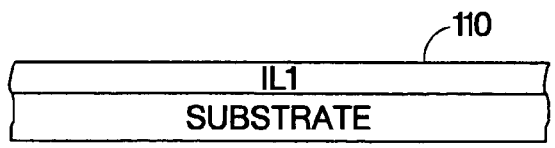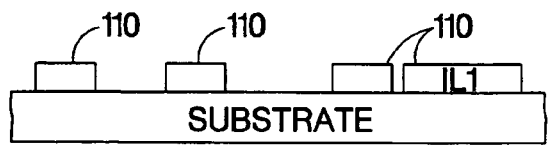
Fig. 8A          Fig. 8B
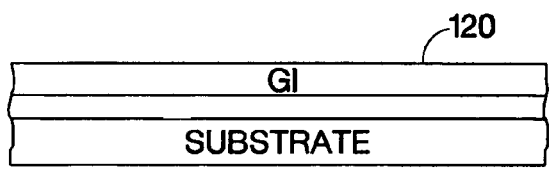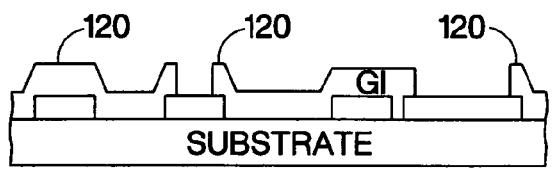
Fig. 9A          Fig. 9B
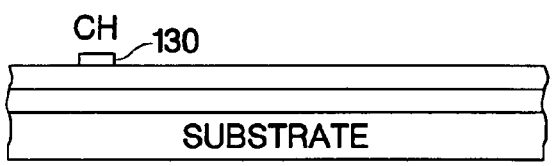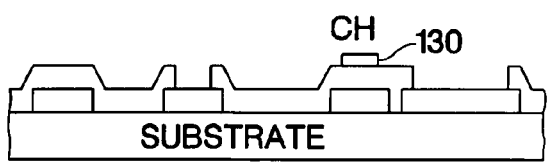
Fig. 10A          Fig. 10B
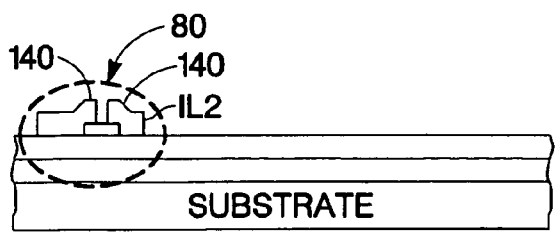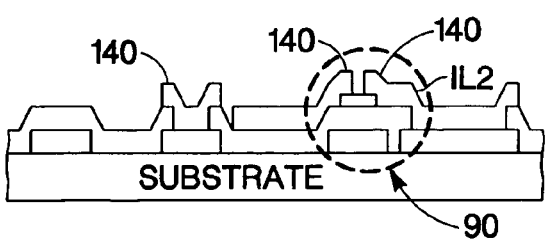
Fig. 11A          Fig. 11B

TRANSPARENT ACTIVE-MATRIX DISPLAY

CROSS-REFERENCE TO RELATED APPLICATION

This application is related to co-pending and commonly assigned application Ser. No. 10/361,065, filed on the same date herewith, Feb. 7, 2003, the entire disclosure of which is incorporated herein by reference.

TECHNICAL FIELD

This invention relates generally to displays and more particularly to transparent active-matrix displays.

BACKGROUND

Active-matrix displays require one or more transistors in each pixel cell to address and drive the optical pixel element. Thin film transistors that have been used for driving display devices have generally comprised amorphous silicon or polycrystalline silicon. Since these materials exhibit photosensitivity to light in the visible spectrum, carriers are generated by incident light, and resistivity of a thin film in such transistors is lowered. For this reason, when the transistors are irradiated with light, the transistors may switch to an ON state, despite a need for the transistor to be controlled in an OFF state. Accordingly, heretofore, to keep the transistors at the OFF state when needed, the lowering of the carrier resistivity of the thin films due to the radiation by light has been prevented by the use of an opaque light shielding layer made of a metal film or the like. Thus, the portion of each pixel cell occupied by the transistor(s) is opaque, reducing the pixel fill factor.

Liquid crystal display devices in particular have been widely used for portable electronic devices such as notebook personal computers. Requirements for such displays include high luminance, miniaturization, and energy saving. To meet these requirements, it is necessary to increase the area ratio of an effective emitting portion to the total area of each pixel in a display. However, the presence of a light shielding layer in the transistor for driving the liquid crystal display device as described above reduces the area ratio ("opening ratio") of the light transmission portion to the area of the light shielding layer in each pixel. Accordingly, a reduction of transistor area by improving performance of the transistor or an improvement of luminance of a backlight are necessary to develop a display device having high luminance. However, the measure to improve the performance characteristics of the transistor limits manufacturing yield, leading to an increase in cost. Moreover, the measure to improve the luminance of the backlight increases energy consumption. Thus, elimination of the need for a light shielding layer is desirable.

Among the applications that have a need for transparent active-matrix displays are displays known as "heads-up" displays and "augmented reality" displays which allow a user to view a real environment beyond the screen of the display.

BRIEF DESCRIPTION OF THE DRAWINGS

The features and advantages of the disclosure will readily be appreciated by persons skilled in the art from the following detailed description when read in conjunction with the drawings, wherein:

FIGS. 8A and 8B-15A and 15B are pairs of front and side elevation cross-sectional views illustrating various stages in fabrication of a single pixel cell for a transparent active-matrix display.

Figure 1:
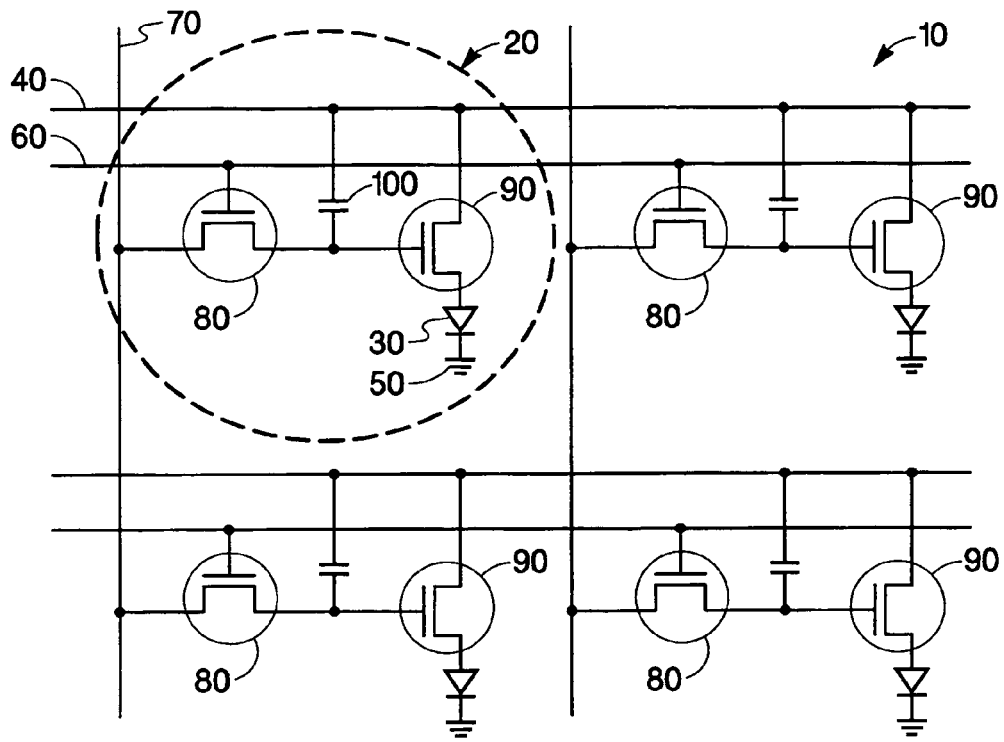
FIG. 1 is a schematic diagram of a first embodiment of a transparent active-matrix display made in accordance with the invention.

The drawings are not drawn to any uniform scale. In particular, vertical and horizontal scales may differ from each other and may vary from one drawing to another.

DETAILED DESCRIPTION OF EMBODIMENTS

In the following detailed description, various embodiments of transparent active-matrix displays made in accordance with the invention are described. Some embodiments are made entirely of substantially transparent materials. Some embodiments include some materials that are not transparent, but in specific applications these embodiments also provide benefits accruing from at least partial transparency. The terms "transparent" and "transparency" as used in the present specification and the appended claims means having substantial transmittance in some spectral range. Thus, in the sense used here, "transparent" and "transparency" include translucence. The spectral range of transparency may be in the visible portion of the electromagnetic spectrum or may be in a non-visible portion of the electromagnetic spectrum such as the infrared portion, or may extend through portions of both visible and non-visible spectral ranges.

In each of the embodiment examples described below, a transparent active-matrix display is provided in which each pixel element is substantially transparent. In particular, the active control elements (i.e., transistors) of each pixel element, as well as the interconnects and any passive devices, are substantially transparent. In general, the optical portion of the pixel element may be emissive, reflective, diffractive, or transmissive and may be selectively colored. Examples of emissive pixel elements include organic light-emitting diodes (OLED's) and thin-film electroluminescent (TFEL) elements. Examples of reflective pixel elements include micro-mirror displays and "electric paper" or gyricon display elements. Examples of diffractive pixel elements include grating light valves. Examples of transmissive pixel elements include liquid-crystal display (LCD) elements (specifically including polymer-dispersed liquid-crystal [PDLC] displays) and electrochromic elements.

Thus, each of the embodiments described below provides a transparent active-matrix display having a transparent substrate and a number of active pixel elements arranged in an array on the substrate, each of the pixel elements being adapted to be set independently to two or more states. Each of the pixel elements is transparent in at least one of its states. A state in which each pixel element is transparent may be a quiescent or un-activated state, for example. Each of the pixel elements may be transparent in all of its states. Transparent electrical connections are made to each pixel element to enable control of the transparent display. Generally, each pixel element comprises at least one transparent control device, e.g. a transparent transistor. In some embodiments, all of the pixel elements may be controlled simultaneously. The related U.S. patent application incorporated herein by reference discloses transparent transistors and methods for making them which are compatible with the methods of the present invention.

The display may have a display area and a non-display area, and the pixel elements may tile the display area of the substrate. Each pixel element has a fill factor, and the fill factor of each pixel element may be substantially 100%. The display may include a number of transparent passive devices, such as resistors and capacitors. In a general sense, the display may be considered a substrate carrying microelectronics, and many types of electronic devices including the transparent active-matrix display may be made.

Thus, a transparent active-matrix display is realized by making the active control elements (i.e., transistors) in each pixel, as well as interconnects and any passive devices, substantially transparent. Such a display may, for example, be incorporated into a transparent window such that the display is invisible when no image is displayed. When a text- or graphic image is displayed, the image may obscure the view through the window, or transparent portions may allow viewing the real environment through the window along with the displayed information. Such displays have been called "augmented reality" displays; the displayed information augments a view of a real-world environment.

Figures 2A, 2B:
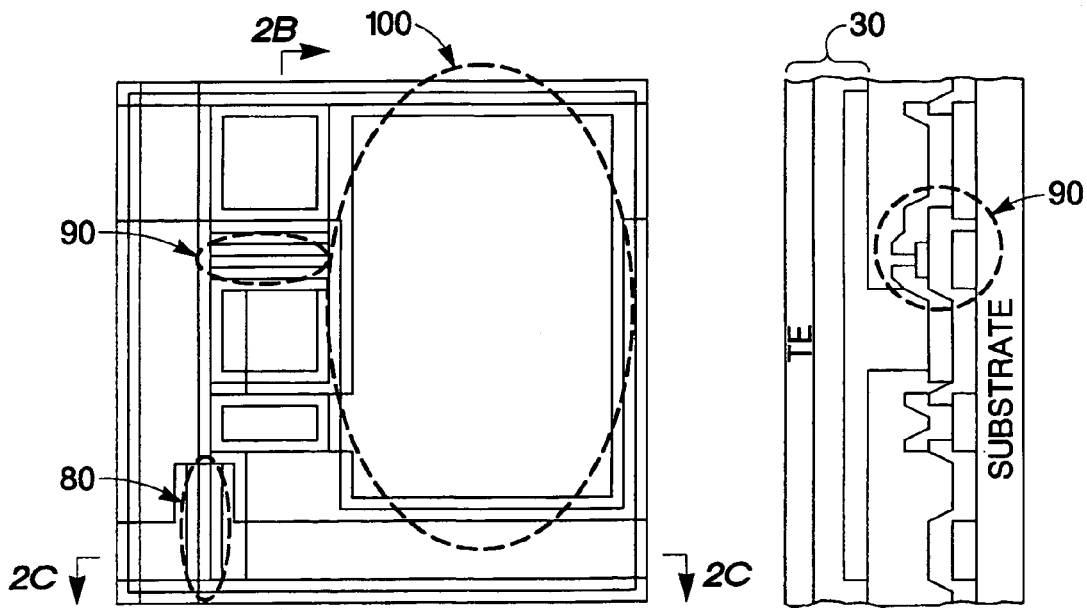
FIG. 2A is a top plan view of a first embodiment of a single pixel cell of a transparent active-matrix display.
FIG. 2B is a side elevation cross-sectional view of the single pixel cell of FIG. 2A.
Figure 2C:
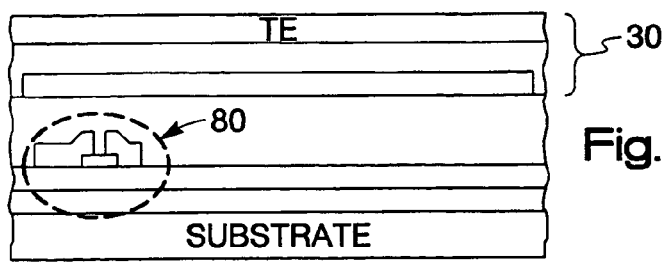
FIG. 2C is a front elevation cross-sectional view of the single pixel cell of FIG. 2A.

FIG. 1 is a schematic diagram of a first embodiment of a transparent active-matrix display 10. The embodiment illustrated in FIG. 1 is an active-matrix organic LED (AMOLED) display. FIG. 1 shows only a portion of a larger array, which may have many more pixel cells. FIG. 1 illustrates circuitry for four pixel cells of the larger array. The portion of FIG. 1 associated with a single pixel cell 20 is indicated by a dashed circle enclosing those components needed for driving and switching a single OLED 30. A supply voltage 40 (VDD) is provided at each pixel element. In the embodiment shown, the anode of each OLED is coupled to ground 50. VDD 40 and ground 50 may be interchanged throughout the device if desired, e.g., because of fabrication process considerations. The matrix has row select lines 60 and column (data) lines 70. One row select line 60 and one column (data) line 70 are associated with each pixel cell. A transistor 80 (T1) switches the state of the pixel cell. Another transistor 90 (T2) drives the OLED 30. A capacitor 100 (C1) stores charge to maintain the state of OLED 30. A physical structure corresponding to AMOLED pixel cell 20 is shown in FIGS. 2A-2C. The various parts of the structure shown in FIGS. 2A-2C will be clear from the description of a method for fabricating it, described below in the section titled "FABRICATION." A transparent active-matrix TFEL display 10 may be made similarly.

The embodiment of FIGS. 1 and 2A-2C may be made on a transparent backplane substrate with bottom-gate transparent thin-film transistors 80 (T1) and 90 (T2). Each transistor may have a channel formed of suitably oriented transparent zinc oxide (ZnO). Each OLED 30 at least partially (preferably fully) overlaps its associated backplane circuitry: transistors 80 (T1) and 90 (T2), storage capacitor 100, and row- and column-line interconnects.

Figure 3:
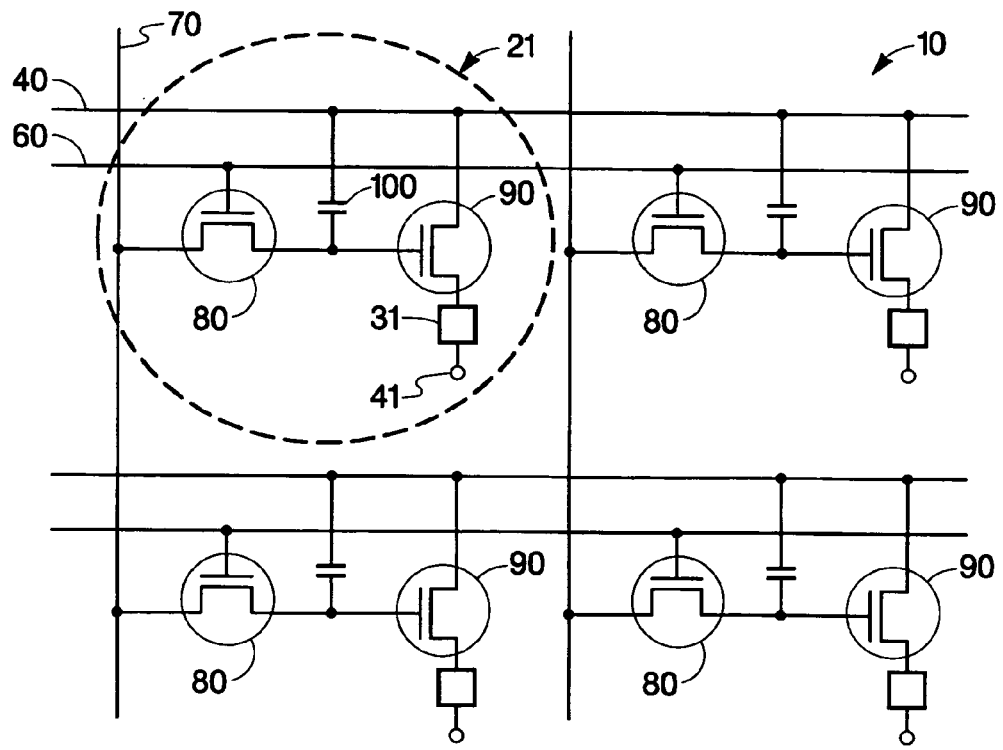
FIG. 3 is a schematic diagram of a second embodiment of a transparent active-matrix display made in accordance with the invention.
Figure 4A:
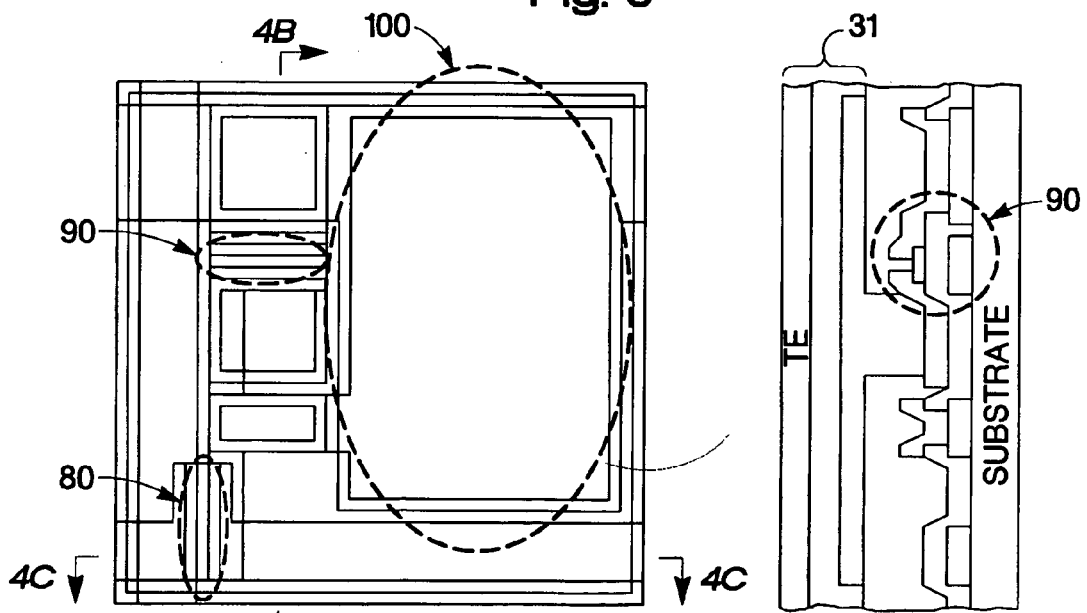
FIG. 4A is a top plan view of a second embodiment of a single pixel cell of a transparent active-matrix display.
Figure 4B:
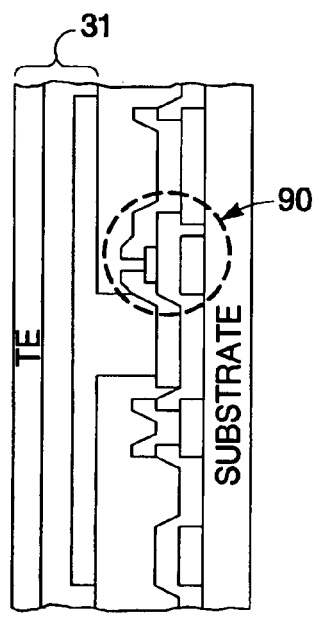
FIG. 4B is a side elevation cross-sectional view of the single pixel cell of FIG. 4A.
Figure 4C:
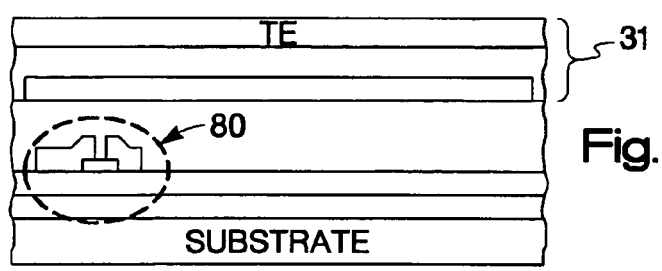
FIG. 4C is a front elevation cross-sectional view of the single pixel cell of FIG. 4A.

FIG. 3 is a schematic diagram of a second embodiment of a transparent active-matrix display 10. The embodiment illustrated in FIG. 3 is an active-matrix electrochromic display. Like FIG. 1, FIG. 3 shows only a portion of a larger array, which may have many more pixel cells, and FIG. 3 illustrates circuitry for four pixel cells of the larger array. The portion of FIG. 3 associated with a single electrochromic pixel cell 21 is indicated by a dashed circle enclosing those components needed for driving and switching a single transmissive electrochromic element 31. A fixed supply voltage 40 (VDD) is provided at each pixel element. In the embodiment shown, one terminal of each electrochromic element 31 is coupled to a voltage source 41 (VEC) which may be switched between two or more voltage levels to control the electrochromic element 31. Supply voltage 40 (VDD) and voltage source 41 (VEC) may be interchanged throughout the device if desired, e.g., because of fabrication process considerations. The matrix has row select lines 60 and column (data) lines 70. One row select line 60 and one column (data) line 70 are associated with each pixel cell. A transistor 80 (T1) switches the state of the pixel cell. Another transistor 90 (T2) drives the electrochromic element 31. A capacitor 100 (C1) stores charge to maintain the state of electrochromic element 31. A physical structure corresponding to electrochromic pixel cell 21 is shown in FIGS. 4A-4C. The various parts of the structure shown in FIGS. 4A-4C will be clear from the description of a method for fabricating it, described below in the section titled "FABRICATION."

The transparent active-matrix electrochromic display embodiment of FIGS. 3 and 4A-4C may be made on a transparent backplane substrate with bottom-gate transparent thin-film transistors 80 (T1) and 90 (T2). Each transistor may have a channel formed of suitably oriented transparent zinc oxide (ZnO). Each electrochromic element 31 at least partially (preferably fully) overlaps its associated backplane circuitry: transistors 80 (T1) and 90 (T2), storage capacitor 100, and row- and column-line interconnects.

A full write cycle comprises the following steps:
1. Switch VEC level so as to write "OFF-state" (opaque) cells;
2. Scan the backplane matrix to turn on drive transistors 90 (T2) for desired "OFF-state" cells;
3. Allow necessary "OFF-state" switching time (typically requiring seconds to minutes of delay);
4. Scan the backplane matrix to turn off all drive transistors 90;
5. Switch VEC level so as to write "ON-state" (transparent) cells;
6. Scan the backplane matrix to turn on drive transistors 90 for desired "ON-state" cells;
7. Allow necessary "ON-state" switching time (typically requiring seconds to minutes of delay); and 8. Scan the backplane matrix to turn off all drive transistors 90.

Optionally, the VEC level may be switched to an appropriate holding voltage (if another write cycle will not be immediately performed, i.e., in a "static" display mode). Steps 1 thru 4 may optionally be exchanged with steps 5 thru 8. The first half-cycle (i.e., the first four steps) may comprise writing all cells alike, effectively "erasing" the display, before writing the new pattern with the second half-cycle.

Although a transparent passive-matrix electrochromic display may be made using the methods of the present invention, the relatively slow switching times of electrochromic devices dictate a correspondingly long time period to change the displayed image by sequentially updating each row of pixels. Active-matrix drive (as opposed to passive-matrix drive) allows the entire display to be updated without the delay at each row due to the electrochromic switching time. The active-matrix electrochromic display of the present invention allows writing data to the entire display, switching the electrochromic pixels elements simultaneously rather than row by row. As in the AMOLED display of FIG. 1, a transparent active-matrix electrochromic display is realized by making the active control elements (i.e., transistors) in each pixel, as well as interconnects and any passive devices, substantially transparent.

Figure 5:
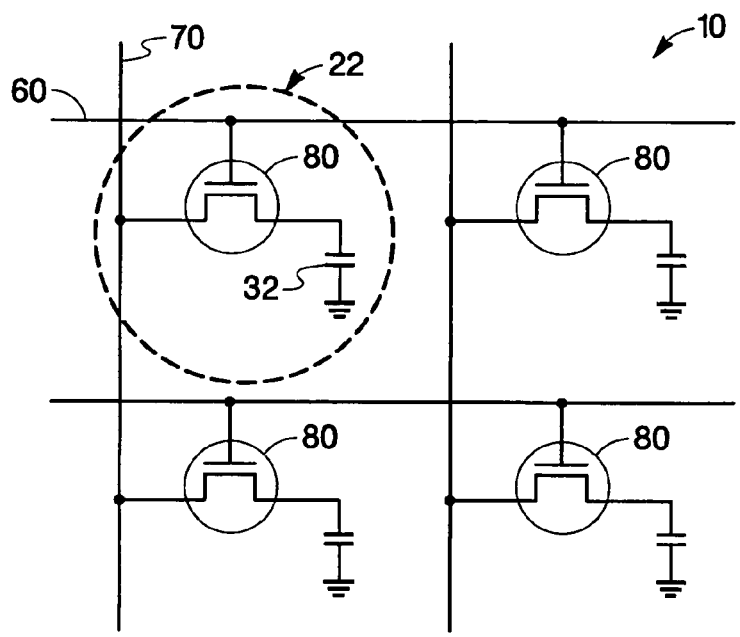
FIG. 5 is a schematic diagram of a third embodiment of a transparent active-matrix display made in accordance with the invention.
Figure 6A:
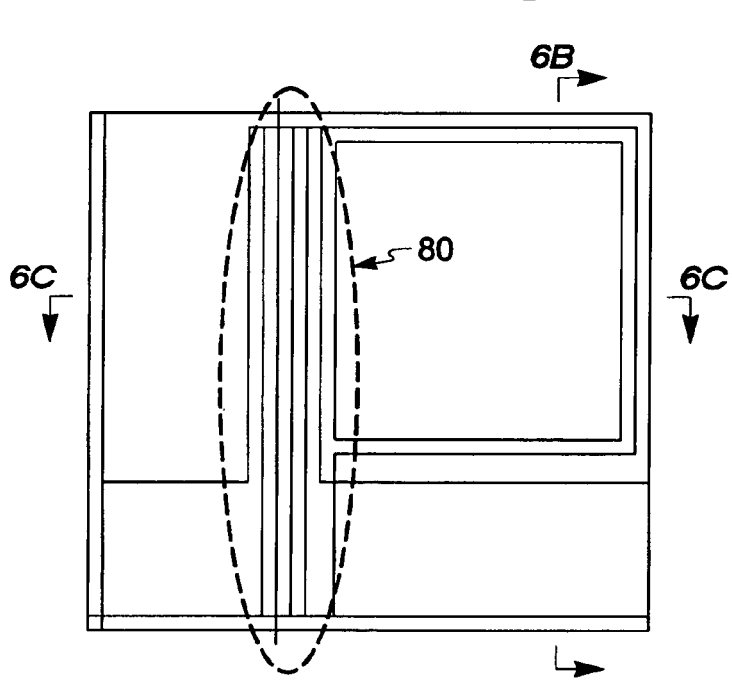
FIG. 6A is a top plan view of a third embodiment of a single pixel cell of a transparent active-matrix display.
Figure 6B:
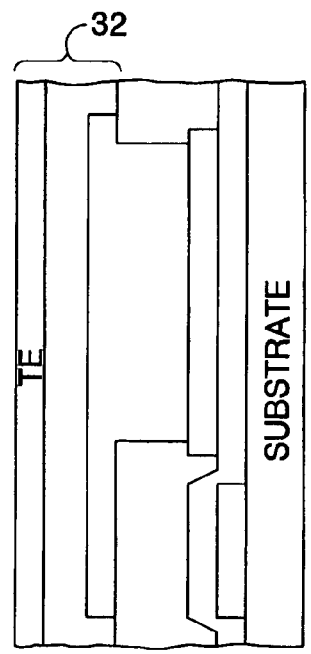
FIG. 6B is a side elevation cross-sectional view of the single pixel cell of FIG. 6A.
Figure 6C:
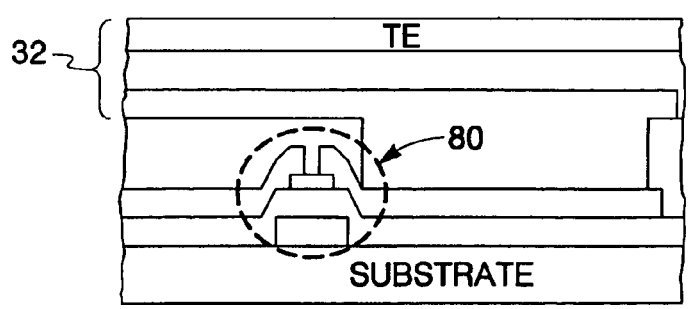
FIG. 6C is a front elevation cross-sectional view of the single pixel cell of FIG. 6A.

FIG. 5 is a schematic diagram of a third embodiment of a transparent active-matrix display 10. The embodiment illustrated in FIG. 5 is a simple active-matrix polymer-dispersed liquid-crystal (AMPDLC) display. Like FIGS. 1 and 3, FIG. 5 shows only a portion of a larger array, which may have many more pixel cells. FIG. 5 illustrates circuitry for four pixel cells of the larger array. The portion of FIG. 5 associated with a single pixel cell 22 is indicated by a dashed circle enclosing those components needed for driving and switching a single PDLC device cell 32. The matrix has row select lines 60 and column (data) lines 70. One row select line 60 and one column (data) line 70 are associated with each pixel cell. A transistor 80 (T1) switches the state of the PDLC cell. A physical structure corresponding to AMPDLC pixel cell 22 is shown in FIGS. 6A-6C. The various parts of the structure shown in FIGS. 6A-6C will be clear from the description of a method for fabricating it, described below in the section titled "FABRICATION."

The transparent AMPDLC display embodiment of FIGS. 5 and 6A-6C may be made on a transparent backplane substrate with bottom-gate transparent thin-film transistors 80 (T1). Each transistor may have a channel formed of suitably oriented transparent zinc oxide (ZnO). Each polymer-dispersed liquid-crystal (PDLC) cell 32 at least partially (preferably fully) overlaps its associated backplane circuitry, transistor 80 (T1) and its row- and column-line interconnects. A storage capacitor 100 (not shown in FIGS. 5 and 6A) is not necessary in an AMPDLC cell, but could be added in parallel with cell 32 if desired.

In operation, row (select) lines 60 are scanned sequentially to load data from column lines 70; data is retained through the scan cycle by the PDLC cell capacitance.

All components shown in FIGS. 1-6 may be made substantially transparent (in at least one state of each individual pixel active element). For many applications, a substantially transparent substrate or backplane is also required to make the entire display substantially transparent. However, transparency of the display does not imply that light must necessarily be emitted from both sides. For some applications, light emission may be needed in only one direction. In such cases, a non-transparent substrate, or a non-transparent back electrode, or a combination of a transparent substrate with a non-transparent electrode on the side opposite the transparent substrate may be used.

The various embodiments described and other embodiments not shown may be made by methods similar to conventional semiconductor integrated circuit and flat-panel display manufacturing methods. Representative methods for fabricating transparent passive-matrix displays are described in the next section.

Fabrication

Figure 7:
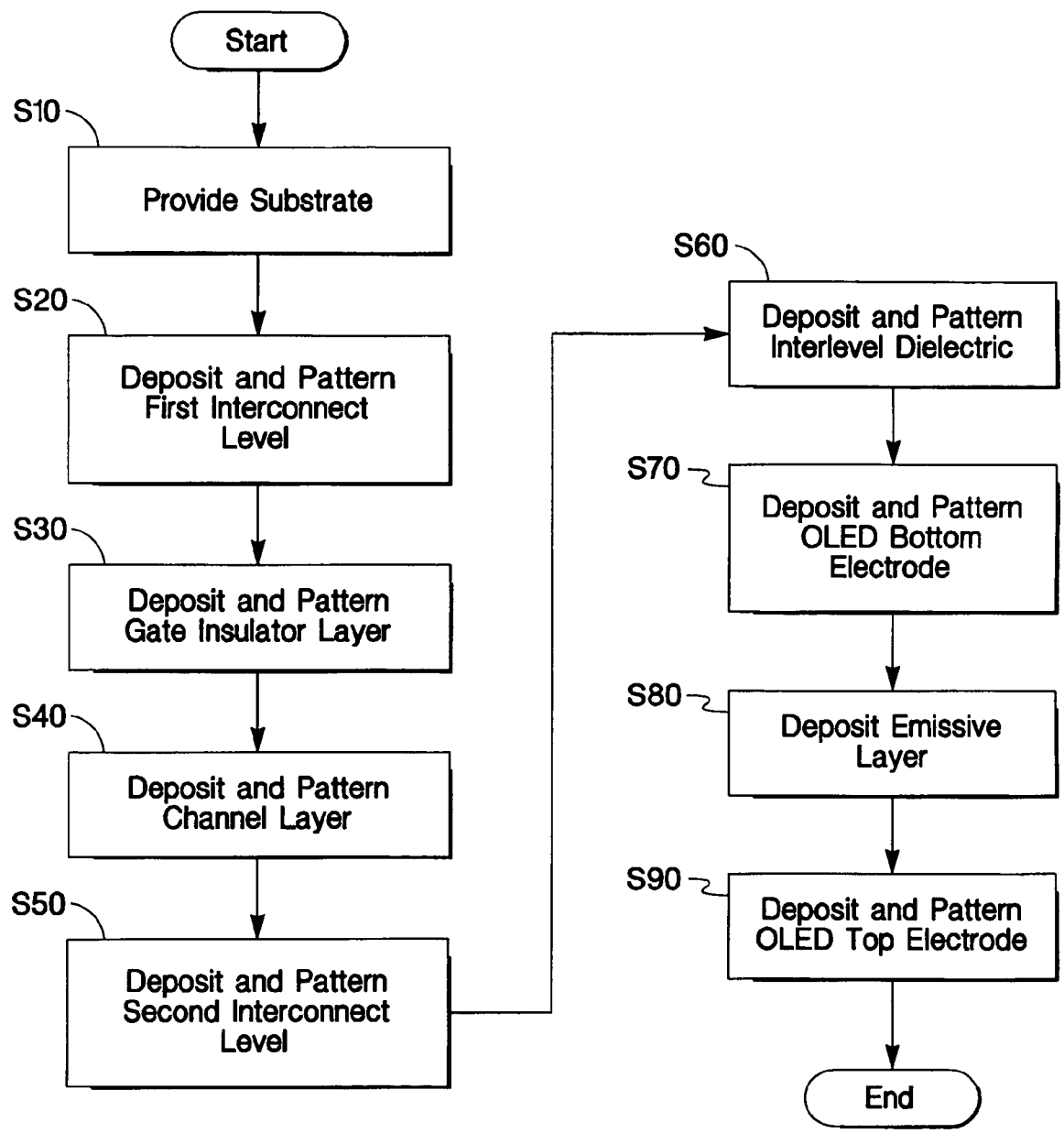
FIG. 7 is a flow chart illustrating an embodiment of a method for fabricating a transparent active-matrix display in accordance with the invention.
Figure 12A:
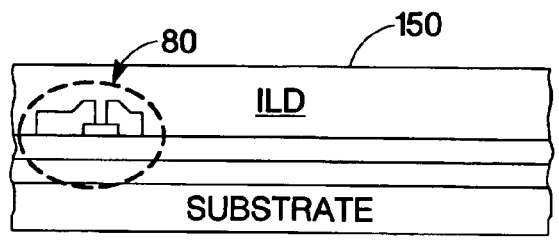
Figure 12B:
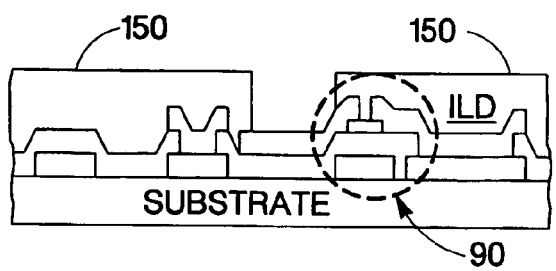

FIG. 7 is a flow chart illustrating an embodiment of a method for fabricating a transparent active-matrix display in accordance with the invention. FIGS. 8A and 8B through 15A and 15B are pairs of front and side elevation cross-sectional views illustrating various stages in fabrication of a single pixel cell for a transparent active-matrix display by the method of FIG. 7 or variations of that method. For example, FIG. 8A is a front elevation view and FIG. 8B is a side elevation view, and the other FIGS. 9A-15B are corresponding views at various stages. Reference numerals S10-S90 denote the various steps performed. While FIG. 7 is expressed in terms of an OLED display for clarity of exposition, it will be understood that analogous steps are performed to fabricate transparent active-matrix displays using other types of pixel elements.

The overall fabrication method for making a transparent active-matrix display device starts by providing a suitable substrate (step S10) (optionally transparent). A first interconnect level 110 (IL1) is deposited and patterned (step S20), FIGS. 8A and 8B. First interconnect level 110 (IL1) may be formed of a transparent thickness of metal (e.g., Au, Al, Cu, In, Ti, W, Ni, or Pt) or doped semiconductor (e.g., $In_2O_3$, $SnO_2$, indium tin oxide [ITO] or ZnO:Al). In step S30, a thin transparent gate insulator layer 120 is deposited and patterned, FIGS. 9A and 9B. Gate insulator layer 120 may be a thin transparent film of $SiO_2$, $Al_2O_3$, or $Si_3N_4$, for example. The thickness of transparent gate insulator layer 120 should be less than about 500 nanometers for conventional dielectrics. The thickness may be made less than 50 nm for some gate insulator materials and may be more that 500 nanometers for high-k dielectrics used as the gate insulator.

In step S40, a transparent channel 130 is formed, by depositing and patterning a thin layer of suitable material, FIGS. 10A and 10B. Channel 130 may be formed of a transparent semiconductor (e.g., $In_2O_3$, $SnO_2$, ZnO, GaN, NiO, $SrCu_2O_2$, $BaCu_2S_2$, LaCuOS, $CuAlO_2$, $CuYO_2$, $CuScO_2$, $CuCrO_2$, $CuInO_2$, ZnS, BaS, or SrS) and may be insulating, semi-insulating, or lightly doped (n-type or p-type). In step S50, a transparent second interconnect level 140 (IL2) is deposited and patterned, FIGS. 11A and 11B. In step S60 a transparent interlayer dielectric 150 (ILD) is deposited and patterned, FIGS. 12A and 12B. Interlayer dielectric 150 (ILD) may be $SiO_2$, $Al_2O_3$, $Si_3N_4$, or a conventional organic dielectric.

Figure 13A:
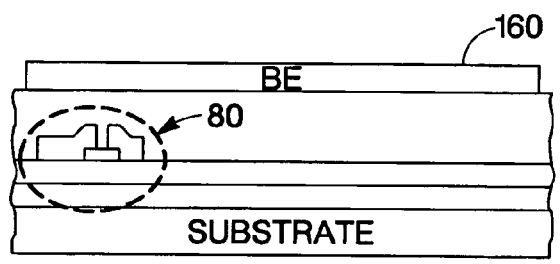
Figure 13B:
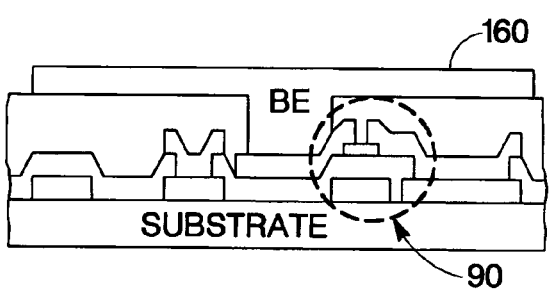
Figure 14A:
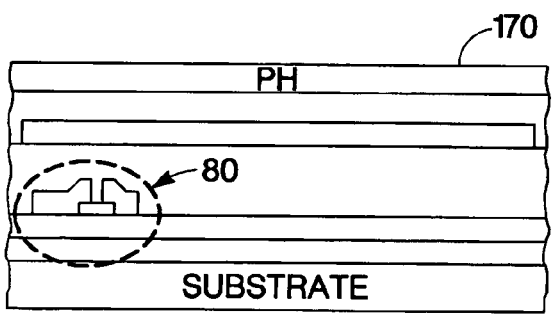
Figure 14B:
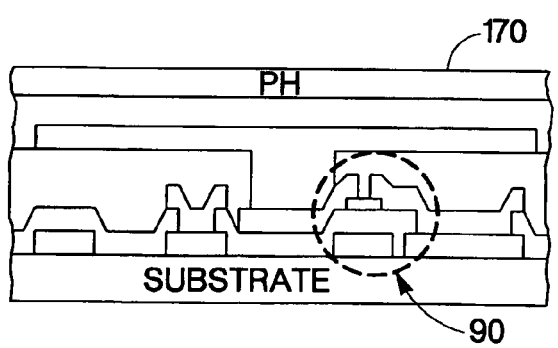
Figure 15A:
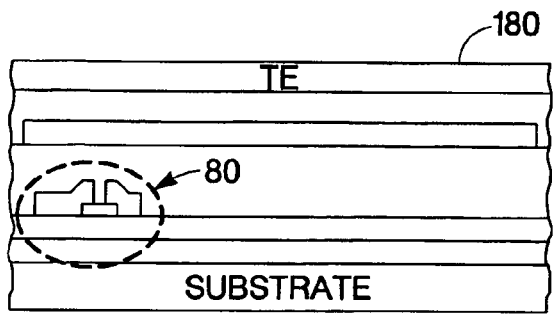
Figure 15B:
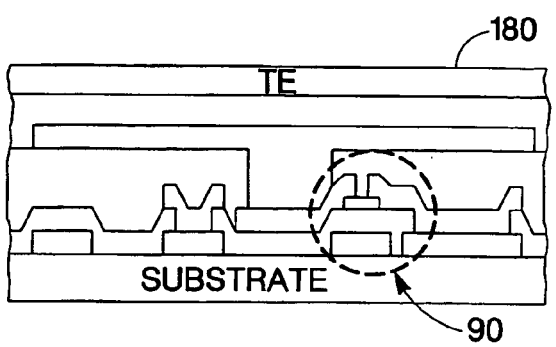

A transparent bottom electrode layer 160 is deposited and patterned in step S70, FIGS. 13A and 13B. Both second interconnect level 140 (IL2) and bottom electrode layer 160 may be formed of a transparent thickness of metal (e.g., Au, Al, Cu, In, Ti, W, Ni, or Pt) or doped semiconductor (e.g., $In_2O_3$, $SnO_2$, indium tin oxide [ITO] or ZnO:Al). In step S80, an emissive layer 170 (such as a phosphor PH) (or equivalent as described below, e.g., a transmissive layer) is deposited, FIGS. 14A and 14B.

A transparent top electrode layer 180 is deposited (FIGS. 15A and 15B) and patterned in step S90, completing the display. Transparent top electrode (TE) layer 180 may have the same or similar composition as interconnect levels 110 (IL1) and 140 (IL2) and bottom electrode layer 160. A fully transparent active-matrix display can be realized by this method, performing the steps in the order presented in FIG. 7, or varying the order in various ways. For example, the order of steps S20-S90 may be completely reversed to make a display with the reverse structure relative to the substrate. Those skilled in the art will recognize that other suitable materials may be substituted for those described.

In step S80, various layers may be used for layer 170, depending on the type of transparent active-matrix display to be made: an OLED layer, an electrochromic material, a polymer-dispersed liquid-crystal layer, etc. To fabricate the transparent active-matrix electrochromic display, a transparent counter-electrode (CE) layer and an ion-storage layer (e.g., NiO) may be deposited and patterned together. The ion-storage layer may be electrochromically active. An ion-transport layer, e.g., $Ta_2O_5$, electrochromic layer e.g., $WO_3$, and transparent top electrode (TE), e.g., ITO, may be deposited and patterned together. Those skilled in the art will recognize that some layers such as top electrodes may be blanket layers, left unpatterned if patterning is not necessary in a particular application.

Figure 16:
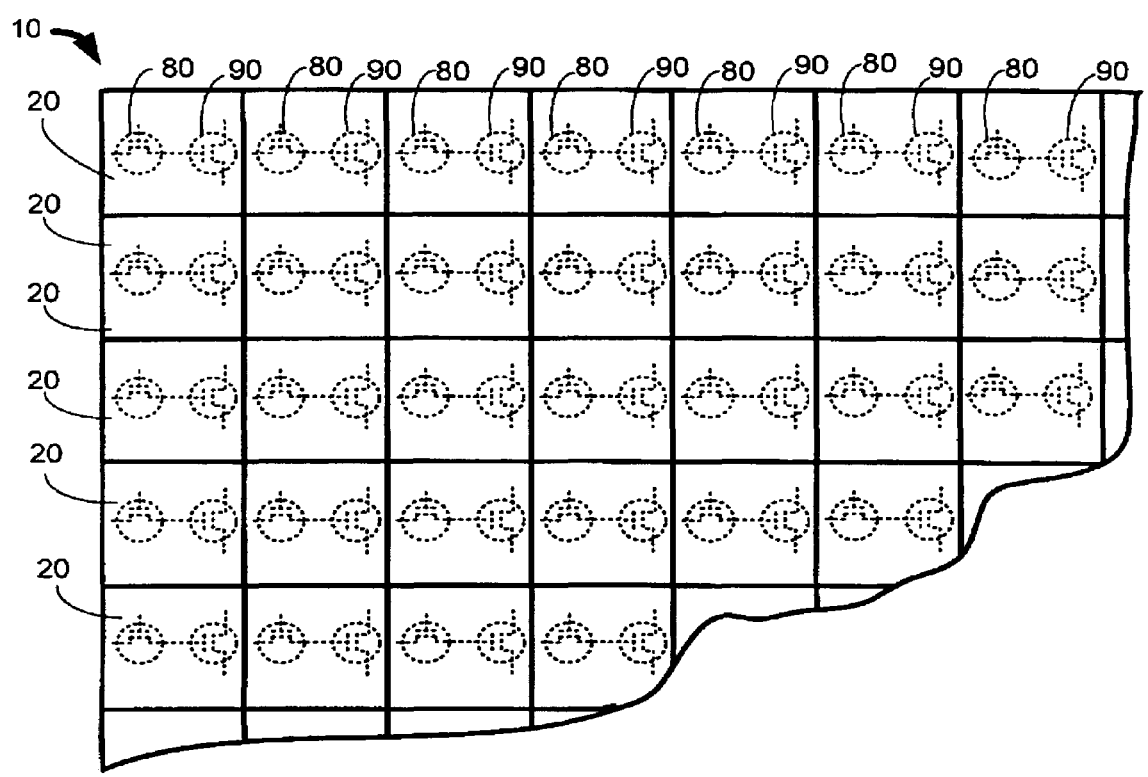
FIG. 16 is a top plan view of portion of an array schematically illustrating a transparent transistor at least partially aligned with each pixel element of the array.

Thus, one aspect of the invention is a method for fabricating a transparent active-matrix display. Another aspect of the invention is the transparent active-matrix display fabricated by such methods. Another aspect of the invention is a method of using a transparent transistor in an active-matrix display device: disposing a quantity of pixel elements in an array, disposing at least one transparent transistor at least partially aligned with each pixel element of the array, and coupling the transparent transistor(s) to the pixel element for controlling the pixel element. Each pixel element may be an emissive element, a reflective element, a diffractive element, a transmissive element, or a selectively colored element. Transparent interconnections coupled to the transparent transistor may be provided. At least one transparent transistor (e.g., transistor 80 or 90) may be disposed at least partially aligned behind each pixel element 20 of the array, or in front of each pixel element of the array, or both (FIG. 16).

A structural aspect of the invention includes a transparent active-matrix display based on a substrate, with a multiplicity of transparent active pixel elements arranged in an array and transparent electrical connections to each pixel, whereby each of the pixel elements is adapted to be set independently to two or more states. In some embodiments, the substrate may also be transparent.

By using an active-matrix array of light-controlling devices made in accordance with the invention, a reconfigurable window or an electrically controllable optical filter such as an unsharp-masking filter may be made. Similarly, a transparent "e-paper" or gyricon display device may be implemented; a gyricon element is substituted for the AMOLED, TFEL, AMPDLC, electrochromic, or other pixel element.

INDUSTRIAL APPLICABILITY

The transparent active-matrix display of the present invention is useful for heads-up and augmented reality displays, reconfigurable windows, and electrically controllable optical filters, among many other applications.

Although the foregoing has been a description and illustration of specific embodiments of the invention, various modifications and changes thereto can be made by persons skilled in the art without departing from the scope and spirit of the invention as defined by the following claims. For example, the transparent structures disclosed can be used in combination with other types of display technologies such as gas-panel, field-emission, and cathode-ray displays, and with display technologies that have not yet been developed.

What is claimed is:

1. A transparent active-matrix display, comprising:
   a) a transparent substrate;
   b) a multiplicity of active pixel elements arranged in an array on the substrate, each of the pixel elements being adapted to be set independently to two or more states, each of the pixel elements being transparent in at least one of its two or more states;
   c) at least one transparent control device coupled to each pixel element, each transparent control device including a transparent field effect transistor; and
   d) transparent electrical connections to each transparent control device whereby the transparent display is adapted to be controlled.

2. The display of claim 1, wherein each of the pixel elements is transparent in all of its two or more states.

3. The display of claim 1, wherein all of the pixel elements are adapted to be controlled simultaneously.

4. The display of claim 1, wherein each transparent control device comprises a transistor.

5. The display of claim 1, wherein the substrate has a display area and a non-display area, and the pixel elements tile the display area of the substrate.

6. The display of claim 1, wherein each pixel element has a fill factor and the fill factor of each pixel element is substantially 100%.

7. The display of claim 1, further comprising a number of transparent passive devices.

8. The display of claim 1, wherein each pixel element comprises an active matrix device selected from the list consisting of an OLED device, an LCD device, a TFEL device, and an electrochromic device.

9. The display of claim 1, wherein each pixel element comprises a device selected from the list consisting of a selectively transmissive device, a selectively emissive device, a selectively reflective device, a selectively absorptive device, and a selectively colored device.

10. The display of claim 1, characterized by substantial transparency in a spectral range including at least one of the visible spectral range and a non-visible spectral range.

11. A substrate with microelectronics, comprising the display of claim 1.

12. An electronic device comprising the display of claim 1.

13. An active-matrix array of light-controlling devices, comprising:
   a) a transparent substrate;
   b) a multiplicity of light-controlling devices arranged in an array on the substrate, each of the light-controlling devices being adapted to be set independently to two or more states, each of the light-controlling devices being transparent in at least one of its two or more states;
   c) at feast one substantially transparent field effect transistor switch coupled to each of the light-controlling devices and at least partially aligned with each of the light-controlling devices, whereby each light-controlling device overlaps the transparent field effect transistor switch thereof; and
   d) electrical connections to each substantially transparent field effect transistor switch, whereby the active-matrix array is adapted to be controlled.

14. The active-matrix array of light-controlling devices of claim 13, wherein the electrical connections are optically transparent.

15. A display comprising the active-matrix array of light-controlling devices of claim 13.

16. A reconfigurable window comprising the active-matrix array of light-controlling devices of claim 13.

17. A transparent active-matrix display, comprising:
 a) a transparent substrate;
 b) a multiplicity of active pixel elements arranged in an array on the substrate, each of the pixel elements being adapted to be set independently to two or more states, each of the pixel elements being transparent in at least one of its two or more states;
 c) at least one transparent control device coupled to each pixel element, each pixel element overlapping the transparent control device thereof, each transparent control device comprising a field-effect transistor, comprising:
  i) an anode,
  ii) a cathode spaced apart from the anode,
  iii) a substantially transparent channel adapted to selectively conduct carriers between the anode and the cathode,
  iv) at least one substantially transparent gate electrode adapted for controlling current in the substantially transparent channel, and
  v) at least one substantially transparent gate insulator,
  the field-effect transistor being adapted to be operable by double injection; and
 d) transparent electrical connections to each transparent control device whereby the transparent display is adapted to be controlled.

\* \* \* \* \*